United States Patent [19]
Glaeser et al.

[11] Patent Number: 4,815,022
[45] Date of Patent: Mar. 21, 1989

[54] PROGRAMMABLE LOGIC ARRAY FOR CARRYING OUT LOGIC OPERATIONS OF BINARY INPUT SIGNALS

[75] Inventors: Winfried Glaeser; Dieter Schuett, both of Munich, Fed. Rep. of Germany

[73] Assignee: Siemens Aktiengesellschaft, Berlin and Munich, Fed. Rep. of Germany

[21] Appl. No.: 51,832

[22] Filed: May 20, 1987

[30] Foreign Application Priority Data

May 30, 1986 [DE] Fed. Rep. of Germany ....... 3618097

[51] Int. Cl.$^4$ ............................................. H03K 19/20
[52] U.S. Cl. ..................................... 364/716; 307/465
[58] Field of Search ......................... 364/716; 307/465; 340/825.83

[56] References Cited

U.S. PATENT DOCUMENTS

| | | | |
|---|---|---|---|
| 3,936,812 | 2/1976 | Cox et al. | 364/716 |
| 3,975,623 | 8/1976 | Weinberger | 364/716 |
| 4,534,008 | 8/1985 | Fuchs et al. | 364/716 |

FOREIGN PATENT DOCUMENTS 0096225 12/1983 European Pat. Off. .

OTHER PUBLICATIONS

Weiss et al., *Integrierte Mos-Schaltungen,* Springer-Verlag, 1982, pp. 295-298.

*Primary Examiner*—David H. Malzahn
*Attorney, Agent, or Firm*—Hill, Van Santen, Steadman & Simpson

[57] ABSTRACT

A programmable circuit for carrying out logic operations on binary input signals. The programmable circuit contains a matrix of first lines crossed with second lines thereby defining intersections at which logic units corresponding to a function table are connected. Two of the first lines are combined to form a line pair. The matrix is programmed in that a logic unit is connected between one of the lines of the line pair and a second line for the binary value of "1" and a logic unit is connected between the other of the lines of the line pair and the second line for programming a binary value of "0". Utilizing control signals, the logic units can be activated either in one direction or the other. Therefore, it is thus possible to set a line pair either as an input or as an output of the programmable circuit. When a line pair acts as an input, the binary signals coupled into the second lines by the logic units are subjected to an AND operation on the second lines. When a line pair is operated as an output, then the binary signals coupled from the second lines onto the first lines of the line pair by the logic units are subjected to a NOR operation.

20 Claims, 9 Drawing Sheets

PROGRAMMABLE LOGIC ARRAY FOR CARRYING OUT LOGIC OPERATIONS OF BINARY INPUT SIGNALS

BACKGROUND OF THE INVENTION

This invention relates generally to programmable circuits for performing logic operations and, in particular, to a programmable circuit having a matrix with crossed first and second sets of lines connected through a respective resistor to an operating voltage source and also having logic units connected at intersections between the first and second lines.

Various types of programmable circuits for implementing logic operations are known in the prior art (see, for example, Weiss, Horninger, Integrierte MOS Schaultungen, Springer Verlag 1982, pp. 295 through 298). These programmable circuits typically contain an AND level of circuitry and an OR level of circuitry. Input signals are received by the programmable circuit in the AND level and are stored in the AND level in accordance with a function table. The operation results of the AND level, also referred to as product terms, are supplied to the OR level and are operated thereon in accord with the function table contained in the OR level to form what are referred to as sum terms. The sum terms are the output of the OR level and also the output of the programmable circuit. Therefore, such a prior art programmable circuit has input lines which lead to the AND level and has output lines which lead from the OR level.

The present invention overcomes the restrictions of the prior art that certain lines are always input lines and other lines are always output lines.

SUMMARY OF THE INVENTION

It is therefore an object of the present invention to provide a programmable circuit such that it can be bidirectionally operated, that is, the lines connected to the programmable circuit can be either input lines or output lines.

The novel programmable circuit performs logic operations on binary input signals. The programmable circuit has a matrix with crossed first and second sets of lines connected through a respective resistor to an operating voltage source and also has logic units connected at intersections between the first and second lines. The first set of lines are paired to form line pairs. The logic units are bidirectionally operable and are connected between each of the second lines and a selected one of the lines of the line pair at each of the intersections. A bidirectional operable driver circuit is connected to an end of one of the first lines of the line pair and opposed to the connection of that first line to the voltage source. Similarly, a driver stage is connected to an end of the other of the first lines of the line pair and opposed to the connection of that first line to the voltage source.

The programmable circuit is therefore no longer composed of a separately executed AND level and an OR level as found in the prior art. On the contrary, it is composed of a matrix of crossed first and second lines and has logic units arranged at the intersections between the first and second lines in accordance with a function table. These logic units are capable of being bidirectionally operated. The first lines can be employed as inputs or as outputs in accordance with the setting of the logic units and of the driver circuit. When first lines are used as inputs, then the input signals supplied to these inputs are transmitted via logic units to the second lines and are subjected to an AND operation on the second lines. When the first lines are employed as outputs, as a result of the setting of the logic units and of the driver circuit, they carry out a NOR operation on the signals which had been transmitted via the logic units from the second lines onto the first lines.

The programmable circuit thus has the advantages that logic operations on input signals can be carried out on a single matrix and that it is possible to utilize the first lines both as inputs for the input signals, as well as, outputs of the operational results. A further advantage of the programmable circuit is the determination of whether the input bit patterns applied to the programmable circuit are in accordance with the realized function table and whether the outputs as a result of the setting of the logic units are a correct function result in accordance with that function table. These determinations are made possible by utilizing a testing network.

BRIEF DESCRIPTION OF THE DRAWINGS

The features of the present invention which are believed to be novel are set forth with particularity in the appended claims. The invention, together with further objects and advantages, may best be understood by reference to the following description taken in conjunction with accompanying drawings, in the several figures of which like reference numeral identify like elements, and in which:

DESCRIPTION OF THE PREFERRED EMBODIMENT

The present invention has general applicability, but is most advantageeously utilized as a programmable circuit for performing logic operations. In general terms, the programmable circuit has a matrix which has a plurality of first lines crossing a plurality of second lines to define a plurality of intersections. The first lines are grouped by twos to form a plurality of line pairs and each line pair has an A first line and a B first line. Logic units are bidirectionally operable and connect each of the first lines to each of the second lines and include in series a switch and a disconnecting mechanism. A plurality of bidirectional driver circuits are connected to first ends of the A first lines of the line pairs. A plurality of driver stages are connected to first ends of the B first lines of the line pairs. A voltage supply is connected to the second ends of the first and second lines via a respective resistor. For performing a logic operation, selected bidirectional logic units are deactivated by their associated disconnecting mechanisms such that each of the second lines is connected by an operational logic unit to either the A first line or the B first line of each of the line pairs.

Figure 1:
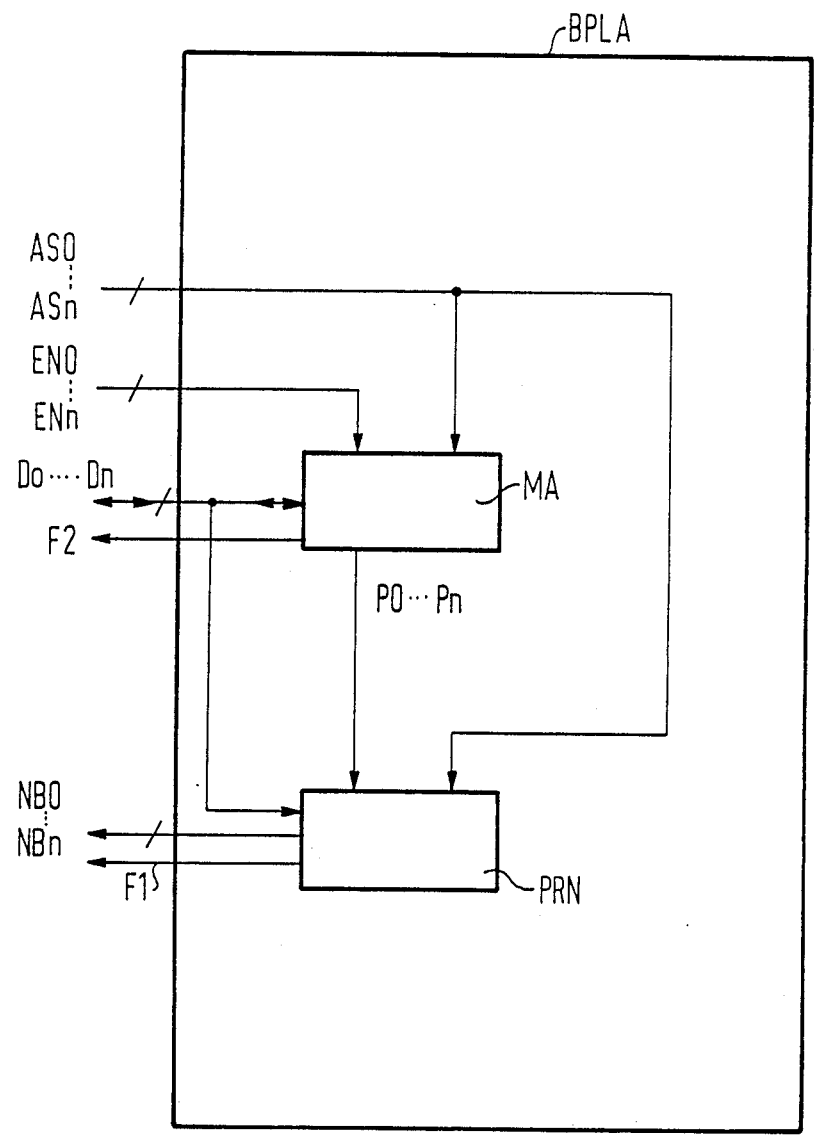
FIG. 1 is a general block diagram of the programmable circuit.

Referring now to FIG. 1, a general block diagram of the programmable circuit BPLA, the programmable circuit BPLA is composed of a matrix MA and may also including a testing network PRN. The matrix MA is connected to data lines $D_0$ through $D_n$ which can be bidirectionally operated. A first set of control signals $EN_0$ through $EN_n$ determine whether the data lines $D_0$ through $D_n$ are utilized as input lines. A second set of control signals $AS_0$ through $AS_n$ determine whether the data lines $D_0$ through $D_n$ are utilized as output lines. The matrix MA outputs test signals $P_0$ through $P_n$ which, together with the first control signals $AS_0$ through $AS_n$ and the signals on the data lines $D_0$ through $D_n$ are supplied to the testing network PRN. By comparison of the test signals $P_0$ through $P_n$ to the signals appearing on the data lines $D_0$ through $D_n$, when these data lines are used as output lines, the testing network PRN can determine whether the matrix MA is being utilized in accordance with a function table stored in the matrix. The significance of the signals F1, F2 and $NB_0$ through $NB_n$ will be described below.

Figure 2:
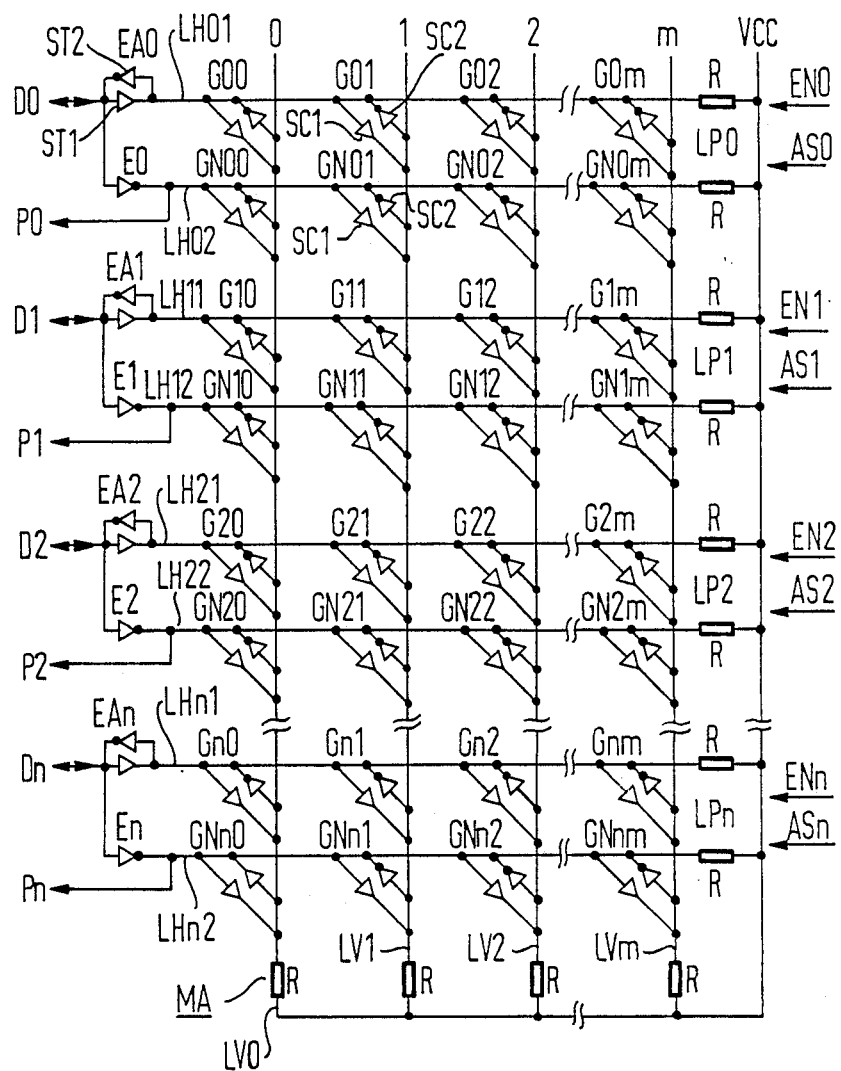
FIG. 2 is a general circuit diagram of a matrix of the programmable circuit.

Referring now to FIG. 2, a complete matrix is depicted which has not yet been programmed in accordance with a function table. It contains first lines LH, second lines LV, logic units G and GN, arranged at the intersections between the first lines LH and the second lines LV, driver circuits EA, and driver stages E. All first lines LH and all second lines LV are connected to an operating voltage source VCC via a respective resistor R.

The two first lines LH are combined to form a line pair LP. Succeeding pairs of lines LH are combined to form other line pairs. The matrix MA contains n+1 line pairs $LP_n$. A first driver circuit EA is connected between a data line D and one first line of the allocated line pair LP. Driver stage E is connected between the data line D and the other first line of the line pair LP. For example, the data line $D_0$ is connected to the first line $LH_{01}$ via the driver circuit $EA_0$ and is connected to the first line $LH_{02}$ via the driver stage $E_0$.

In the depiction of FIG. 2, m+1 second lines $LV_0$ through $LV_m$ are provided, logic units G, GN, which are each composed of two switch elements SC1 and SC2 in the preferred embodiment, lie between the first lines LH and the second lines LV. Utilizing the first control signals EN, the first switch elements SC1 can be switched off; and utilizing the second control signals AS, the second switch elements SC2 can be switched off. In the FIG. 2 embodiment, the first switch elements SC1 are shown as non-inverting switch elements and the switch elements SC2 are shown as inverting switch elements. The arrangement of the switch elements SC1 and SC2 is referred to as a connection in antiparallel fashion.

All logic units are identically operated, however, the logic units which are connected to the first line are referenced G and the logic units which are connected to the other first line of a line pair are referenced GN. The difference in designation will be explained in reference to FIG. 9.

Figure 5:
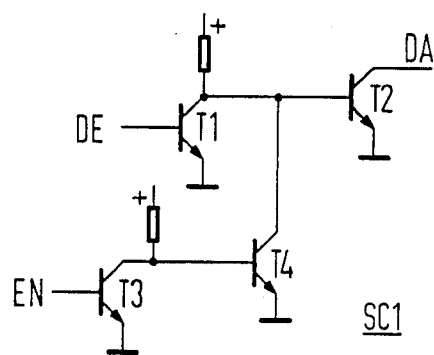
FIG. 5 is a preferred embodiment of a first switching element of the logic unit.

One embodiment of the first switch element SC1 is shown in FIG. 5. It is composed, for example, of four npn transistors T1 through T4. The first control signal EN is applied to the base of transistor T3. When it is present, that is, when the switch element is to be conductive for data signal DE, then the transistor T3 is activated and the transistor T4 is inhibited thereby. The switch element is thus not influenced by the first control signal EN. A data signal DE at the transistor T1 is thus transmitted to the output DA. The transistor T2 is realized in open-collector circuitry. Thus, when a binary "0", is applied at the input DE, the transistor T2 is activated and pulls the allocated second line LV to "0" potential. By contrast, when a binary "0" is applied at the input DE, then the transistor T2 is inhibited and the potential on the allocated, second line LV is not influenced via the switch element SC1. Similarly, the potential on the allocated, second line LV is not influenced when the first control signal EN is binary "0". When the first control signal EN is binary "0" the transistor T4 is activated thus inhibiting the transistor T2.

Figure 6:
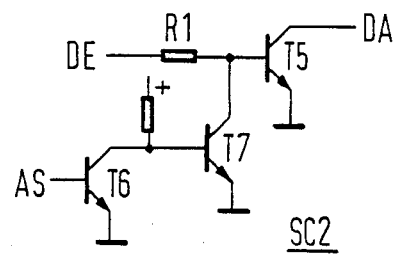
FIG. 6 is a circuit diagram of a second switching element of the logic unit.

FIG. 6 schematically depicts an embodiment of the second switch element SC2. It is composed of the transistors T5, T6 and T7 and of the resistor R1. The second control signal AS is applied to the base of the transistor T6. In this case, the transistor T6 is activated and the transistor T7 is inhibited. The signal at the input DE can thus act on the transistor T5 via the resistor R1. When the signal at the input DE is binary "1" then the transistor T5 is activated and pulls the potential on the allocated, second line LV to ground or zero potential. When the signal at the input DE is binary "0", then the transistor T5 remains inhibited and the potential on the allocated, second line is not influenced. When the second control signal AS is binary "0", then the transistor T6 is inhibited but the transistor T7 is activated. This results in the transistor T5 being inhibited and, thus, the second control signal AS cannot influence the potential on the allocated, second line LV. Here, too, the output stage of the switch element SC2 is realized as an open-collector circuit.

The driver circuit EA connected at the input of each of the first lines LH is constructed in accordance with the logic units G. It can likewise be switched with the assistance of the control signals EN and AS. When, thus, the first control signal EN is binary "1", then the driver stage ST1 is connected and the driver stage ST2 is inhibited. When, by contrast, the second control signal AS is utilized, then the driver stage ST2 is operational and the driver stage ST1, by contrast, is inhibited.

Figure 7:
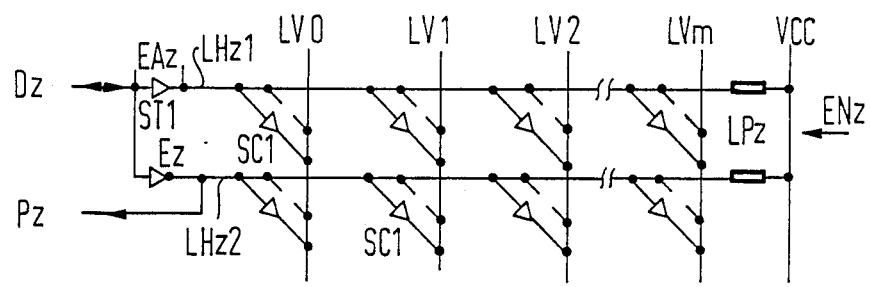
FIG. 7 is a schematic illustration of a portion of the matrix depicting first lines used as inputs.

FIG. 7 shows the electrical operation of the matrix when the first lines $LH_z$ are employed as input lines and, thus, $D_z$ is an input. In this case, all second switch elements SC2 are to be considered as being non-existent and only the first switch elements SC1 are effective. Likewise, the first driver stage ST1 of the driver circuit $EA_z$ is effective but the second driver stage ST2 is not.

Figure 8:
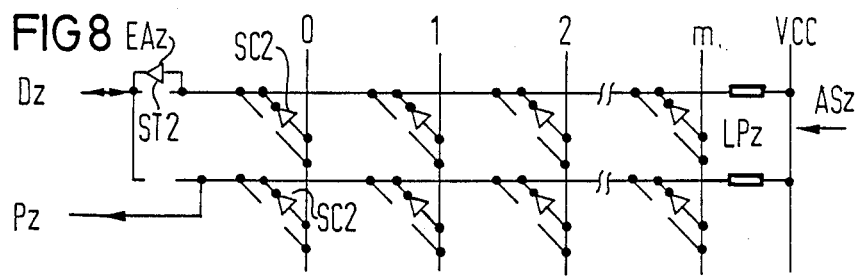
FIG. 8 is a schematic illustration of a portion of the matrix depicting first lines used as outputs.

FIG. 8 illustrates the opposite situation, wherein $D_z$ is an output. Accordingly, the second control signal $AS_z$ is utilized and the first switch elements SC1 are now not effective but the second switch elements SC2 are. Similarly, the second driver stage ST2 of the driver circuit $EA_z$ is effective but the driver stage ST1 is not. Furthermore, the driver stage $E_z$ is also not effective.

Figure 9:
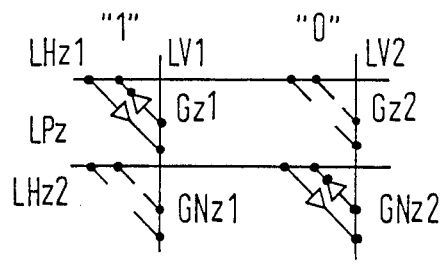
FIG. 9 is a schematic illustration showing an example of programming the matrix.

It can be shown from FIG. 9 how the matrix is programmed in accordance with a function table. When a binary "1" is to be programmed at an intersection between the line pair $LP_z$ and a second line, for example $LV_1$, then the logic unit $G_{z1}$ lying between the first line $LH_{z1}$ and the second line $LV_1$ is utilized. By contrast, the logic unit $Gn_{z1}$ lying between the other first line $LH_{z2}$ and the second line $LV_1$ remains non-functioning. When, by contrast, a binary "0" is to be programmed, for example between the line pair $LP_z$ and the second line $LV_2$, then the logic unit $G_{z2}$ connected between the first line $LH_{z1}$ and the second line $LV_2$ remains non-functioning but the logic unit $Gn_{z2}$ connected between the first line $LH_{z2}$ and the second line $LV_2$ is utilized. When, thus, a binary "1" is to be programmed at an intersection between a line pair LP and a second line LV, then a logic unit G is connected between one of the first lines of the line pair and the second line LV; when, by contrast, a binary "0" is to be programmed, then the logic unit GN is arranged between the other first line of the line pair and the second line LV. The logic units which are provided for programming the binary "1" are referenced G and those employed for programming the binary "0" are referenced GN.

Figure 3:
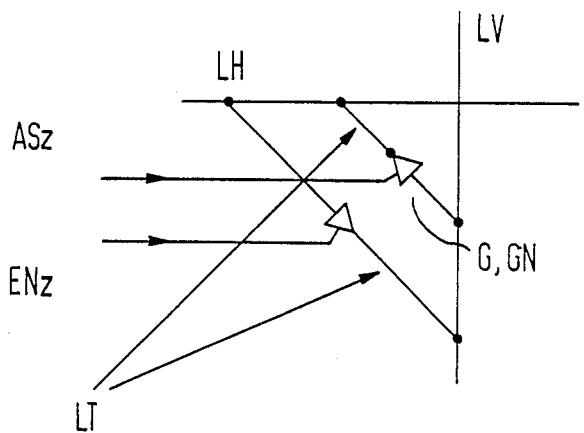
FIG. 3 is a circuit diagram depicting a logic unit used in the FIG. 2 circuit.

The programming of the logic units can be carried out with the assistance of one or two line levels LT. The two switch elements SC1 and SC2 must then be respectively wired or not wired between the levels. FIG. 3 shows an example of this situation. The locations of the logic unit G or, respectively, GN are indicated with arrows and can be present or not be present.

Figure 4:
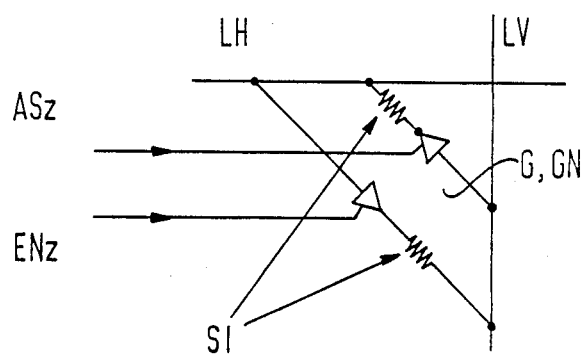
FIG. 4 is a circuit diagram of an alternative embodiment of the logic unit in the FIG. 2 circuit diagram.

Further, a possible realization of the programming with the assistance of the logic units can be achieved in accordance with FIG. 4. Here, fuses SI are inserted between every switch element SC1, SC2 and an allocated first or second line and these fuses are capable of being parted, thus eliminating the switch element from the circuit. When the logic unit is to represent a binary "1" or a binary "0", then the fuses are electrically continuous and connect the switch element in the circuit; otherwise, the fuse element is parted.

Figure 11:
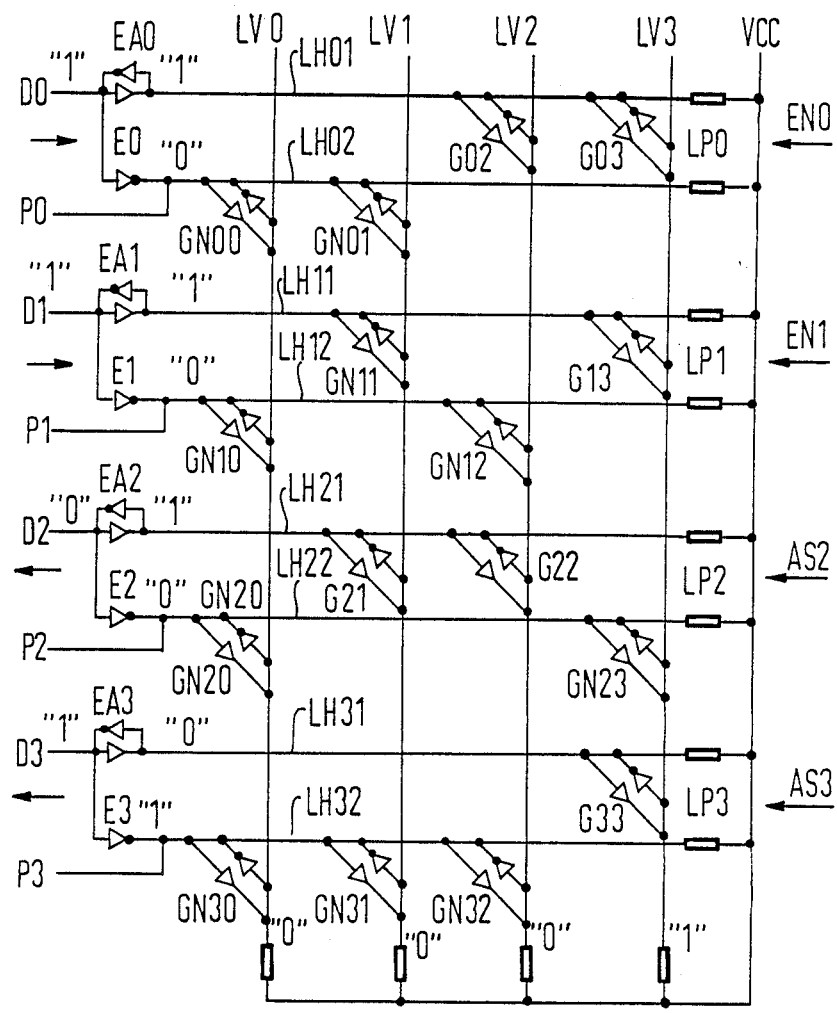
FIG. 11 is a schematic illustration of the matrix depicting the matrix utilized as an adder.

The programming of the matrix MA as an adder is shown in FIG. 11. In this depiction, $D_0$ and $D_1$ have been selected as inputs and $D_2$ and $D_3$ have been selected as outputs. The value for the sum is outputted at the output $D_2$ and the value for the overflow is outputted at the output $D_3$. The arrangement of the logic units in the matrix corresponds to a function table that is established given a modulo-2 addition of two input values. For example, the second line $LV_0$ in combination with the allocated, first lines, shows the programming for $D_0 =$ "0" and $D_1 =$ "0". The sum is then $D_2 =$ "0" and the carry is $D_3 =$ "0". The second line $LV_3$ shows the relationships when a binary "1" is applied to the inputs $D_0$ and $D_1$. The sum at the output $D_2$ is then $D_2 =$ "0" and the carry at the output $D_3$ is $D_3 =$ "1". The logic units connected to the second lines $LV_1$ and $LV_2$ correspond to the two other combinations possible for input signals at the inputs $D_0$ and $D_1$ and to the resulting output signals at the sum output $D_2$ and at the carry output $D_3$.

In order to utilize $D_0$ and $D_1$ as inputs, the first control signals EN and $EN_1$ must be applied to the matrix on line pairs $LP_0$ and $LP_1$, respectively. In the logic units connected to the line pairs $LP_0$ and $LP_1$, the first switch elements SC1 are effective, but the second switch elements SC2 are not effective. The situation is different at the outputs $D_2$ and $D_3$. Here, the second control signals $AS_2$ and $AS_3$ are applied to the line pairs $LP_2$ and $LP_3$, respectively, and, thus, the second switch elements SC2 are respectively effective in the line pair $LP_3$ and $LP_2$, but the first switch elements SC1 are not effective. Of the driver circuits EA, the driver stages ST1 are effective for the line pair $LP_0$ and $LP_1$ and the driver stages ST2 are effective for the line pairs $LP_2$ and $LP_3$.

As an example of the functioning of the adder depicted in FIG. 11, a binary "1" is applied to both inputs $D_0$ and $D_1$. A binary "1" then occurs on the first lines $LH_{01}$ and $LH_{11}$, by contrast, a binary "0" occurs on the other first lines $LH_{02}$ and $LH_{12}$. Since the first control signals $EN_0$ and $EN_1$ are applied to line pairs $LP_0$ and $LP_1$, only the first switch elements in the line pairs $LP_0$ and $LP_1$ are effective. Accordingly, the logic units $GN_{00}$ and $GN_{01}$ apply a binary "0" to the second lines $LV_0$ and $LV_1$ just as the logic units $GN_{10}$ and $GN_{12}$ apply a binary "0" to the second line $LV_0$ and $LV_2$. By contrast, a binary "1" is applied to the second line $LV_3$ via the logic units $G_{03}$ and $G_{13}$. It may be seen that a respective AND operation of the binary values supplied to the inputs $D_0$ and $D_1$ is carried out on the second lines LV.

As a result of the second control signals $AS_2$ and $AS_3$, the line pairs $LP_2$ and $LP_3$ operate as outputs. Accordingly, the second switch elements SC2 are effective, as is the second driver stage ST2. The binary signal "1" on the second line $LV_3$ places the line $LH_{22}$ to binary "0" via the logic unit $GN_{23}$ and places the line $LH_{31}$ to binary "0" via the logic unit $G_{33}$. The binary "0" on the second lines $LV_0$, $LV_1$, $LV_2$ act on the lines $LH_{21}$ and $LH_{32}$ via the logic units $G_{21}$, $G_{22}$, $GN_{30}$, $GN_{31}$, $GN_{32}$ and generate a binary "1" thereon. It may now be seen that a respective NOR operation of the binary values coupled in from the second lines LV via the logic units appear on the first lines LH. The correct values are then obtained at the outputs $D_2$ and $D_3$ via the second, inverting driver stage ST2.

Figure 12:
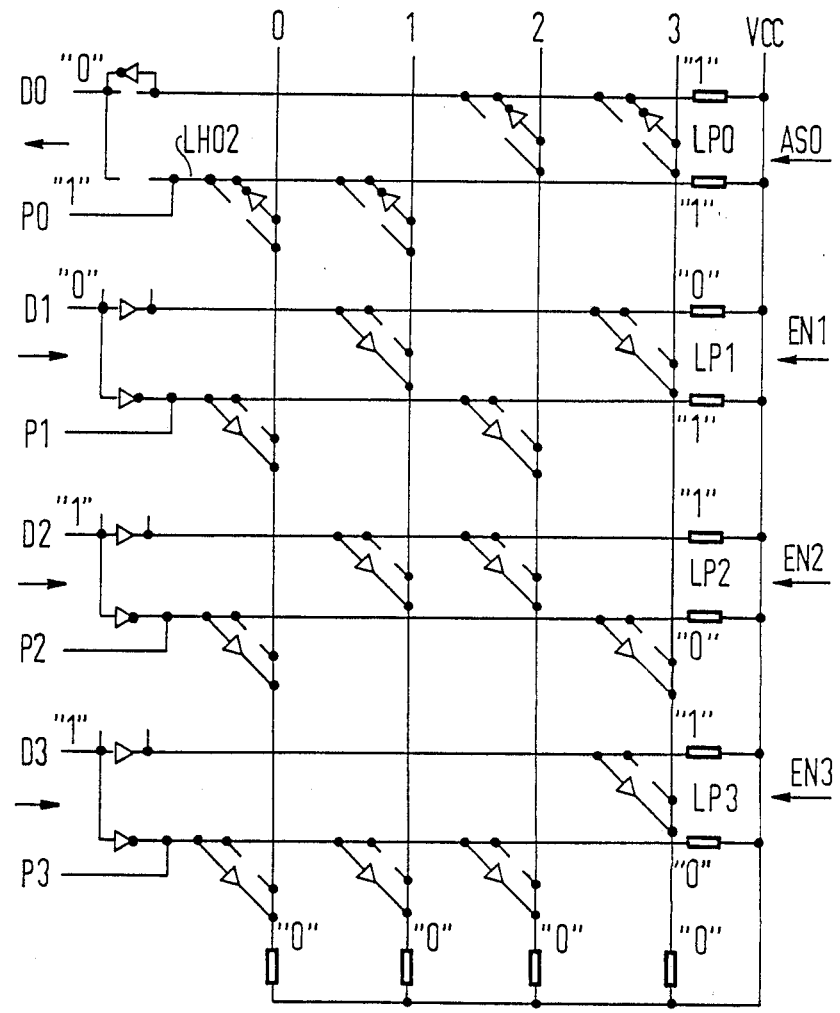
FIGS. 12 and 13 are schematic illustrations depicting two examples of programming the matrix as an adder and operating the matrix by setting logic units according to the function table.

FIG. 12 shows the matrix programmed as an adder with $D_1$, $D_2$ and $D_3$ operating as inputs and $D_0$ operating as an output. This is effected by utilizing the second control signal $AS_0$ and the first control signals $EN_1$, $EN_2$ and $EN_3$. In order to clearly illustrate the functioning of the matrix, only the respective switch elements which are effective due to the control signals $AS_0$, $EN_1$, $EN_2$ and $EN_3$ are shown in FIG. 12. The other switch elements are not shown although they are actually present in the circuit although non-conductive. The binary values indicated in FIG. 12 are applied to the inputs $D_1$, $D_2$ and $D_3$. The binary values shown in the FIG. 12 are then derived on the second lines $LV_0$ through $LV_3$. They are all binary "0". The first lines of the line pair $LP_0$, operating as an output, then carry a binary "1". After inversion by the inverting driver stage, a binary "0" is then applied to the output $D_0$. The lines $LV_0$ through $LV_3$ are binary "0". An operation of the matrix which does not correspond to the function table is present. This is determined by means of the circuit shown in FIG. 10 and will be explained in detail below.

Figure 13:
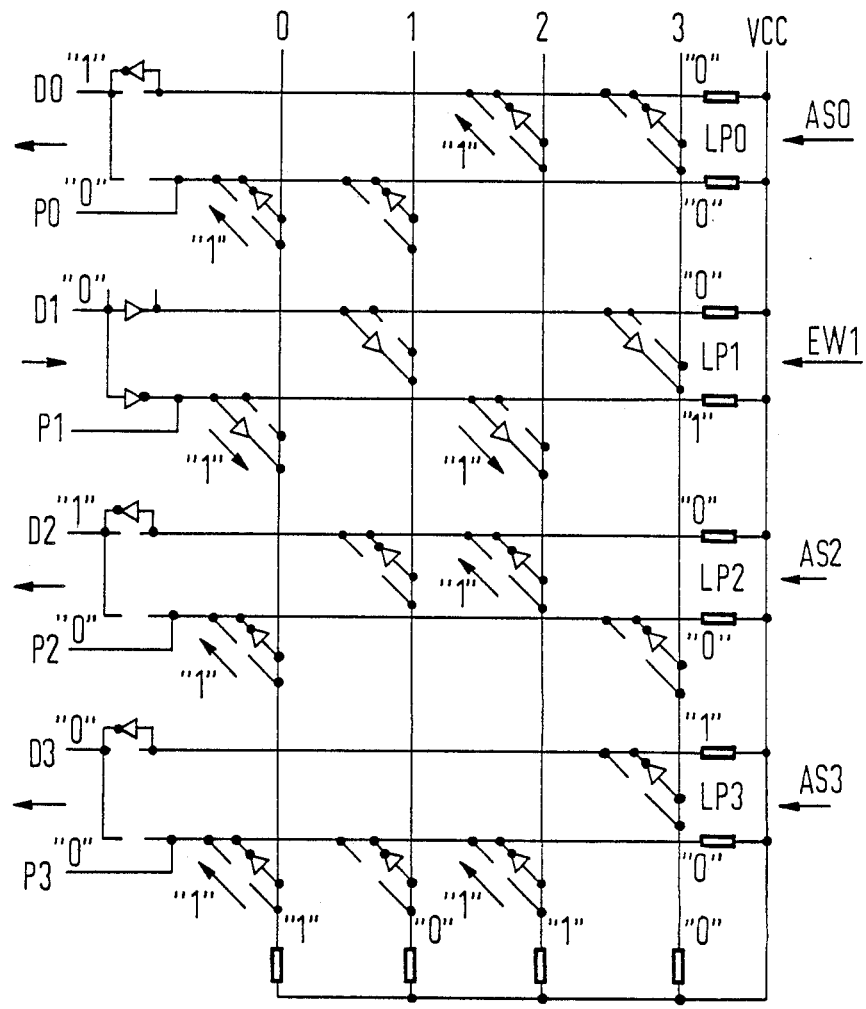

In FIG. 13, the matrix is programmed as an adder and is operated with $D_1$ as input and $D_0$, $D_2$, $D_3$ as outputs. The first control signal $EN_1$ is now applied at the line pair $LP_1$ and the second control signals $AS_0$, $AS_2$, $AS_3$ are applied at the line pairs $LP_0$, $LP_2$, $LP_3$. Only the switch elements of the logic units which are effective due to the control signals are again shown. When a binary "0" is applied at the input $D_1$, then the binary values shown in FIG. 13 derive on the second lines $LV_0$ through $LV_3$. The feedback of these binary values onto the line pair $LP_0$ results in the fact that a binary "0" appears at both first lines. This output $D_0$ can thus not be determined. The analogous case applies to the line pair $LP_2$. The allocated output $D_2$ is likewise not determinable. A binary "1" appears only on one line of the line pair $LP_3$. A binary "0" appears on the other line of line pair $LP_3$. This binary value pair corresponds to the function table contained in the matrix. The output $D_3$ can thus be determined.

Figure 14:
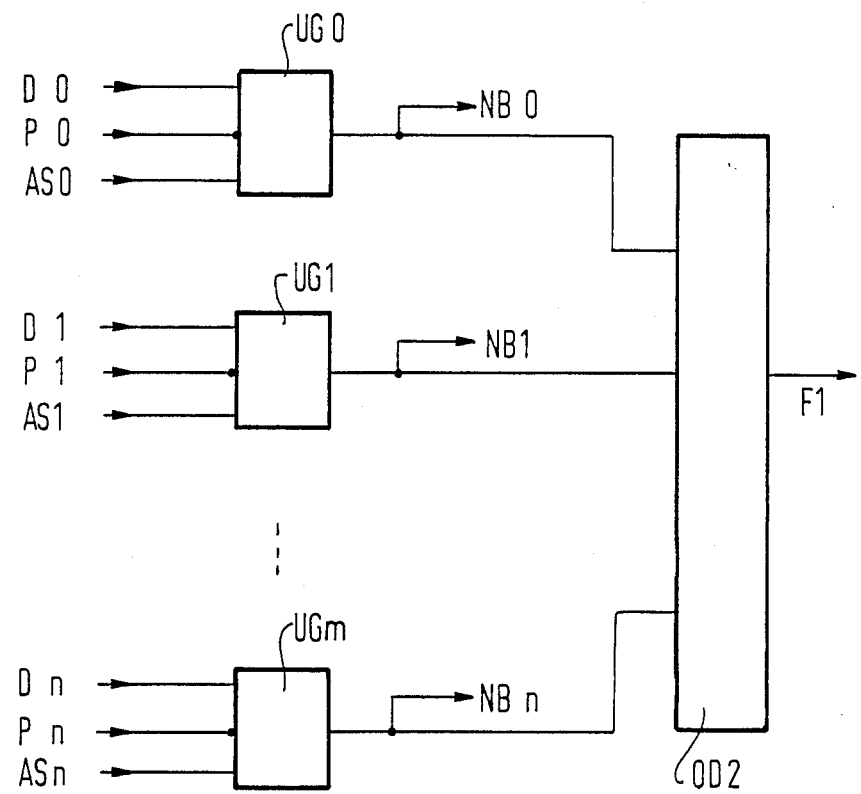
FIG. 14 is a general block diagram depicting a testing network for use with the matrix.

The line pairs which operate as outputs and which carry identical binary values can be identified by checking the values at the outputs D and the values of the test signals P with the assistance of the testing network shown in FIG. 14. It was found that the outputs $D_0$ and $D_2$ cannot be determined from the FIG. 13 example. A checking of the function of the matrix can be carried out with the assistance of the testing network of FIG. 14. To that end, every line pair $LP_0$ through $LP_n$ has a respective AND element, $UG_0$ through $UG_n$, allocated to it. The signal on the data line D, the test signal P and the second control signal AS are supplied to every AND element UG. The AND element outputs an error signal NB at its output when the signal on the data line D is binary "1" and the test signal P is binary "0". In this case, this output cannot be determined. The output signals of the AND elements $UG_0$ through $UG_n$ are combined to form an error signal F1, via an OR element $OD_2$.

Figure 10:
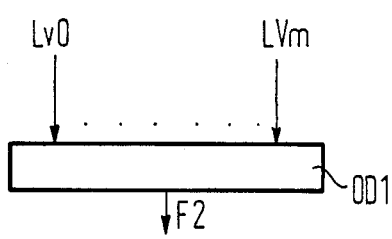
FIG. 10 is a schematic illustration depicting the circuit arrangement for determining whether the input bit pattern applied to the matrix is contained in a function table stored in the matrix.

Whether a second line exhibits the binary value "1" can be determined with the assistance of the OR circuit $OD_1$ of FIG. 10 by means of which the second lines $LV_0$ through $LV_m$ are combined. One second line carries the value binary "1" when the input bit pattern applied to the inputs is present in the function table. A signal F2 can be derived therefrom. When this signal F2 is "0", then the applied bit pattern is not contained in the function table.

Thus, every type of logic function can be realized with the matrix. The requirement is the realization of the function table underlying the logic function in the matrix. It is also possible to utilize a permanently programmed matrix and to select the number of inputs or, respectively, outputs and to check the output values by applying first and second control signals.

Advantageous the testing network can be utilized to identify whether an applied input bit pattern leads to a defineable output value or not.

In the preferred embodiments, the logic units have been depicted as two switch elements. It is also envisioned that the logic units can be bidirectionally operated single switch elements.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter of the above depiction shall be interpreted as illustrative and not in a limiting sense.

What is claimed is:

1. A programmable circuit for performing logic operations on binary input signals having a matrix with crossed first and second lines, each of said first and second lines connected through as respective resistor to an operating voltage source, and also having logic units connected at intersections between the first lines and the second lines, comprising:
   at least one line pair formed from two first lines;
   a plurality of bidirectional operable logic units, a respective logic unit of said plurality of logic units being connected between one of said first lines of said line pair and each of said second lines and a respective logic unit of said plurality of logic units being connected between the other of said first lines of said line pair and each of said second lines;
   bidirectional operable driver circuit connected to an end of said one of said first lines of said line pair which is opposed to an end of said one of said first lines which is connected to the voltage source; and
   driver stage connected to an end of the other of said first lines of said line pair which is opposed to an end of said other of said first lines which is connected to the voltage source.

2. A programmable circuit according to claim 1, wherein said logic unit comprises two switch elements connected in anti-parallel fashion and separately disconnectable.

3. A programmable circuit according to claim 2, wherein one of said switch elements is a non-inverting switch element and the other of said switch elements is an inverting switch element.

4. A programmable circuit according to claim 3, wherein each of said switch elements have an output circuit with an open-collector output transistor circuit which forms a non-inverting switch element when a zero binary value is received by the switch element and which forms an inverting switch element when a one binary value is received by the switch element thereby applying a fixed potential to a line connected to said output circuit.

5. A programmable circuit according to claim 3, wherein said driver circuit comprises two driver sections connected in anti-parallel fashion and separately disconnectable.

6. A programmable circuit according to claim 3, wherein one of said driver sections is a non-inverting driver section and the other of said driver section is an inverting driver section.

7. A programmable circuit according to claim 6, wherein for operation of said line pair as an input, said non-inverting driver sections and said non-inverting switches of said logic units are activated.

8. A programmable circuit according to claim 6, wherein for operation of said line pair as an output, said inverting driver sections and said inverting switches of said logic units are activated.

9. A programmable circuit according to claim 6, wherein switching of said switching elements and of said driver sections is initiated by at least one control signal.

10. A programmable circuit according to claim 1, wherein said driver stage is an inverter and wherein for operation of said line pair as an input, said driver stage is activated.

11. A programmable circuit according to claim 1, wherein said logic unit is connected at a selected intersection between said second line and a selected one of said first lines of said line pair when a column in a function table representing the logic operation prescribes a predetermined binary value.

12. A programmable circuit according to claim 11, wherein, for operation of said first lines as inputs, said logic units are activated and provide binary signals to said second lines from said first lines to carry out a logical AND operation.

13. A programmable circuit according to claim 12, where, for operation of said first lines as outputs, said logic units are activated and provide binary signals from said second lines to said first lines to carry out a logical NOR operation.

14. A programmable circuit according to claim 1, wherein said second lines are connected to an OR circuit which produces an output signal representative of an input bit pattern applied to the matrix being contained in a function table.

15. A programmable circuit according to claim 1, wherein said circuit further comprises a testing network which, when said line pair is operated as an output, compares a first signal generated on said other of said first lines of said line pair to a second signal generated from an output of said bidirectional operable driver circuit of said one of said first lines of said line pairs.

16. A programmable circuit according to claim 15, wherein said testing network generates an error signal when said first signal is a binary "1" and said second signal is a binary "0".

17. A programmable circuit according to claim 16, wherein said testing network has a separate AND circuit connected to each of said line pairs.

18. A programmable circuit for performing logic operations comprising:
matrix having a plurality of first lines crossing a plurality of second lines to define a plurality of intersections, said first lines grouped by twos to form a plurality of line pairs, each having an A first line and a B first line;
means for bidirectionally connecting each of said first lines to each of said second lines including in series a means for switching and a means for disconnecting;
a plurality of first means for bidirectionally driving a signal, respectively connected to a first end of said A first line of each of said line pairs;
a plurality of second means for driving a signal, respectively connected to a first end of said B first line of each of said line pairs; and
means for supplying a voltage to second ends of said first and second lines;
wherein for performing a selected logic operation predetermined ones of said means for bidirectional connecting are deactivated by their respective means for disconnecting such that each of said second lines is connected by predetermined others of said means for bidirectional connecting to either said A first line or said B first line of each of said line pairs.

19. A programmable circuit according to claim 18, wherein said means for bidirectional connecting comprises first and second switch elements connected in anti-parallel fashion, said first switch element being rendered non-conductive in response to a first control signal and said second control being rendered non-conductive in response to a second control signal; and
wherein said first means for bidirectionally driving a signal comprises first and second drive sections connected in anti-parallel fashion, said first driver section being connected in circuit in response to said first control signal and said second driver section being connected in circuit in response to said second control signal; and
wherein said first and second control signals determine if each of said line pairs functions as an input or as an output of said matrix.

20. A programmable circuit according to claim 19, wherein said first switch element is non-inverting, said second switch element is inverting, said first driver section is non-inverting and said second driver section is inverting, said first and second control signals activating said first switch elements and said first driver sections for a line pair to function as an input to said matrix and activating said second switch elements and said second driver section for a line pair to function as an output of said matrix.

* * * * *